US009557384B2

(12) United States Patent
Matsuo et al.

(10) Patent No.: US 9,557,384 B2
(45) Date of Patent: Jan. 31, 2017

(54) TESTING DEVICE

(71) Applicant: Renesas Electronics Corporation, Kawasaki-shi, Kanagawa (JP)

(72) Inventors: Yukikazu Matsuo, Itami (JP); Makoto Nishigaki, Itami (JP); Masaru Sugimoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 589 days.

(21) Appl. No.: 14/089,428

(22) Filed: Nov. 25, 2013

(65) Prior Publication Data
US 2014/0145746 A1 May 29, 2014

(30) Foreign Application Priority Data
Nov. 26, 2012 (JP) ................. 2012-257494

(51) Int. Cl.
G01R 1/06 (2006.01)
G01R 31/319 (2006.01)

(52) U.S. Cl.
CPC ... G01R 31/31907 (2013.01); G01R 31/31908 (2013.01)

(58) Field of Classification Search
CPC ..... G11C 29/02; G01R 31/31908; G01R 1/06; G06F 9/30145; G06F 9/3016; G09G 5/222
See application file for complete search history.

(56) References Cited

U.S. PATENT DOCUMENTS

| 3,341,820 | A  | * | 9/1967  | Grillmeier, Jr. | ......... | G06F 13/22 705/42    |
|-----------|----|---|---------|-----------------|-----------|----------------------|
| 6,651,023 | B2 | * | 11/2003 | Mori            | ........  | G01R 31/3167 702/108 |
| 6,930,931 | B2 |   | 8/2005  | Matsuo          |           |                      |
| 7,404,130 | B2 | * | 7/2008  | Shimura         | .........  | G01R 31/31831 714/738 |
| 2002/0053045 | A1 | * | 5/2002 | Gillenwater    | ........ | G06F 11/2273 714/38.14 |
| 2004/0103357 | A1 | * | 5/2004 | Nishida        | ............ | G01R 31/31707 714/738 |

FOREIGN PATENT DOCUMENTS

JP  2004-151990  5/2004

* cited by examiner

Primary Examiner — Phung M Chung
(74) Attorney, Agent, or Firm — Foley & Lardner LLP

(57) ABSTRACT

A testing device has plural pin electronics substrates and a control substrate. The control substrate includes a first instruction code memory storing an instruction code, a first program counter incrementing a count in synchronization with a clock, a code analysis circuit analyzing the instruction code read from the first instruction code memory in accordance with a counter value, and a control data output control circuit outputting control data for controlling the pin electronics substrates in accordance with the instruction code. Each pin electronics substrate includes a first pin memory storing pin data, a second program counter incrementing a count in synchronization with the clock, and a pin data output control circuit adjusting, based on control data, the count value of the second program counter and outputting pin data read from the first pin memory, the pin data being dependent on the count value of the second program counter.

6 Claims, 17 Drawing Sheets

FIG. 4

| NOP | 0x0000 |
|---|---|
| REP 2 | 0x1005 |
| STOP | 0x2000 |
| C1J –1 | |
| C2J –5 | |
| JST1 | |
| JST2 | |
| ⋮ | ⋮ |

FIG. 7

| 01 | LABEL | A |
| --- | --- | --- |
| 10 | JUMP START | B |
| 11 | JUMP END | C |

FIG. 9A

| 0 | C2L | 3 |
| 1 | JST2 | |
| 2 | C1L | 3 |
| 3 | JST1 | |
| 4 | C1J | −1 |
| ⋮ | ⋮ | |

REPEATED UNTIL VALUE IN REGISER C1 BECOMES 0

FIG. 9B

| 0 | C2L | 3 |
| 1 | JST2 | |
| 2 | C1L | 3 |
| 3 | JST1 | |
| 4 | C1J | −1 |
| 5 | NOP | |
| 6 | C2J | −5 |

REPEATED UNTIL VALUE IN REGISER C1 BECOMES 0

REPEATED UNTIL VALUE IN REGISER C2 BECOMES 0

FIG. 9C

| 0 | C2L | 3 |
| 1 | JST2 | |
| 2 | C1L | 3 |
| 3 | JST1 | |
| 4 | C1J | −1 |
| 5 | NOP | |
| 6 | C2J | −5 |
| 7 | REP | 2 |
| 8 | STOP | |

FIG. 11

| PC VALUE ON CONTROL SIDE | | PC VALUE ON PIN SIDE | PC VALUE STACKING | | PIN DATA |
|---|---|---|---|---|---|
| 0 | | PROGRAM COUNTER OUTPUTS "0" | | | 0 |
| 1 | A | PROGRAM COUNTER OUTPUTS "1" | 56 — [ 1 ] | | 1 |
| 2 | | PROGRAM COUNTER OUTPUTS "2" | | | 0 |
| 3 | A | PROGRAM COUNTER OUTPUTS "3" | 56 — [ 3 / 1 ] | | 1 |
| 4 | B | PROGRAM COUNTER OUTPUTS "4" | 56 — [ 3 / 1 ] | 58 — [ 4 ] | 0 |
| 3 | | PROGRAM COUNTER (FOR JUMP) OUTPUTS "3" | 56 — [ 3 / 1 ] | 58 — [ 4 ] | 1 |
| 4 | | PROGRAM COUNTER (FOR JUMP) OUTPUTS "4" | 56 — [ 3 / 1 ] | 58 — [ 4 ] | 0 |
| 3 | | PROGRAM COUNTER (FOR JUMP) OUTPUTS "3" | 56 — [ 3 / 1 ] | 58 — [ 4 ] | 1 |
| 4 | C | PROGRAM COUNTER (FOR JUMP) OUTPUTS "4" | 56 — [ 1 ] | 58 — [ – ] | 0 |
| 5 | | PROGRAM COUNTER OUTPUTS "5" | 56 — [ 1 ] | 58 — [ – ] | 1 |

FIG. 12

| PC VALUE ON CONTROL SIDE | | PC VALUE ON PIN SIDE | PC VALUE STACKING | PIN DATA |
|---|---|---|---|---|
| 6 | B | PROGRAM COUNTER OUTPUTS "0" | 56—[ 1 ]→ 58—[ 6 ]  "1" IS SET ON PROGRAM COUNTER (FOR JUMP) | 0 |
| 1 | | PROGRAM COUNTER (FOR JUMP) OUTPUTS "1" | 56—[ 1 ]   58—[ 6 ] | 1 |
| 2 | | PROGRAM COUNTER (FOR JUMP) OUTPUTS "2" | 56—[ 1 ]   58—[ 6 ] | 0 |
| 3 | A | PROGRAM COUNTER (FOR JUMP) OUTPUTS "3" | 56—[3/1]   58—[ 6 ] | 1 |
| 4 | B | PROGRAM COUNTER (FOR JUMP) OUTPUTS "4" | 56—[3/1]→ 58—[4/6]  "3" IS SET ON PROGRAM COUNTER (FOR JUMP) | 0 |
| 3 | | PROGRAM COUNTER (FOR JUMP) OUTPUTS "3" | 56—[3/1]   58—[4/6] | 1 |
| 4 | | PROGRAM COUNTER (FOR JUMP) OUTPUTS "4" | 56—[3/1]   58—[4/6] | 0 |
| 3 | | PROGRAM COUNTER (FOR JUMP) OUTPUTS "3" | 56—[3/1]   58—[4/6] | 1 |
| 4 | C | PROGRAM COUNTER (FOR JUMP) OUTPUTS "4" | 56—[ 1 ]   58—[ 6 ] | 0 |
| 5 | | PROGRAM COUNTER (FOR JUMP) OUTPUTS "5" | 56—[ 1 ]   58—[ 6 ] | 1 |
| 6 | | PROGRAM COUNTER (FOR JUMP) OUTPUTS "6" | 56—[ 1 ]   58—[ 6 ] | 0 |
| ⋮ | | | | |
| 6 | C | PROGRAM COUNTER (FOR JUMP) OUTPUTS "6" | 56—[ - ]   58—[ - ] | 0 |
| 7 | | PROGRAM COUNTER OUTPUTS "7" | | 1 |
| 7 | | PROGRAM COUNTER OUTPUTS "7" | | 1 |
| 8 | | PROGRAM COUNTER OUTPUTS "8" | | 0 |

FIG. 13A

| 0 | 0 |
|---|---|
| 1 | 1 |
| 2 | 0 |
| 3 | 1 |
| 4 | 0 |

REPEATED UNTIL JUMP END SIGNAL C IS INPUTTED

FIG. 13B

| 0 | 0 |
|---|---|
| 1 | 1 |
| 2 | 0 |
| 3 | 1 |
| 4 | 0 |
| 5 | 1 |
| 6 | 0 |

REPEATED UNTIL JUMP END SIGNAL C IS INPUTTED

FIG. 13C

| 0 | 0 |
|---|---|
| 1 | 1 |
| 2 | 0 |
| 3 | 1 |
| 4 | 0 |
| 5 | 1 |
| 6 | 0 |
| 7 | 1 |
| 8 | 0 |

TESTING DEVICE

CROSS-REFERENCE TO RELATED APPLICATIONS

The disclosure of Japanese Patent Application No. 2012-257494 filed on Nov. 26, 2012 including the specification, drawings and abstract is incorporated herein by reference in its entirety.

BACKGROUND

The present invention relates to a testing device for testing a semiconductor device.

There have been testing devices each for testing a semiconductor device (hereinafter may also be referred to as a "DUT" standing for a device under test) removably coupled thereto, for example, via a socket. For such testing devices, it is imperative to improve testing efficiency by increasing the number of pins which can be tested simultaneously so as to facilitate mass-production of semiconductor devices. Each testing device is required to offer not only enhanced functions and performance but also flexibility to be compatible with diversified testing processes at reasonable cost.

To enable simultaneous testing of multiple pins while holding the price of the testing device low so as to facilitate testing cost reduction, such a testing device is comprised of plural pin electronics substrates for controlling plural pins, respectively, and a common control substrate for controlling all the pin electronics substrates together.

Each pin electronics substrate includes a memory storing pin data for the corresponding pin. The control substrate includes a program counter which outputs a count value to be an address of the above memory in accordance with an instruction code (see, for example, Japanese Unexamined Patent Publication No. 2004-151990). As operation common to all pins, in each pin electronics substrate, the pin data corresponding to the program counter value is read out and controlled.

SUMMARY

There is a tendency in which the number of bits of program counter values increases to allow diversified testing processes. It is necessary to couple wirings for program counter values to each pin electronics substrate. When, for example, program counter values are represented by 28 bits and a total of 16 pin electronics substrates are provided, 448 wirings are required for the program counter values. Considering physical conditions involved in substrate mounting work, however, it is extremely difficult to provide 448 wirings between a control substrate and the respective pin electronics substrates. Hence, it has been required that the number of the wirings be reduced.

Other objects and novel features of the present invention will become apparent from the description of this specification and the accompanying drawings.

According to an embodiment of the present invention, a testing device for testing a chip includes a plurality of pin electronics substrates which can respectively output pin data to pins included in a chip and a control substrate provided to be shared by the pin electronics substrates. The control substrate includes a first instruction code memory storing an instruction code, a first program counter incrementing a count in synchronization with a clock signal, a code analysis circuit which analyzes the instruction code read from the first instruction code memory in accordance with the count value of the first program counter, and a control data output control circuit which outputs control data for controlling the pin electronics substrates in accordance with the instruction code analyzed by the code analysis circuit. Each of the pin electronics substrates includes a first pin memory storing pin data, a second program counter which increments a count in synchronization with the clock signal, and a pin data output control circuit which, based on control data outputted from the control data output control circuit, adjusts the count value of the second program counter and outputs pin data read from the first pin memory, the pin data being dependent on the count value.

According to an embodiment of the present invention, many pins can be simultaneously tested using a reduced number of wirings.

BRIEF DESCRIPTION OF THE DRAWINGS

FIG. 4 is a table for explaining instruction codes according to the embodiment.

FIG. 7 is a table for explaining loop mode signals inputted to a signal generation circuit 54 according to the embodiment.

FIGS. 9A to 9C are diagrams for explaining internal states of an instruction memory (for jump) 40 according to the embodiment.

FIG. 11 is a first diagram for explaining the pin data dependent on the program counter value on a pin electronics substrate 20 side according to the embodiment.

FIG. 12 is a second diagram for explaining the pin data dependent on the program counter value on the pin electronics substrate 20 side according to the embodiment.

FIGS. 13A to 13C are diagrams for explaining internal states of a pin control memory (for jump) 62 according to the embodiment.

DETAILED DESCRIPTION

Figure 1:
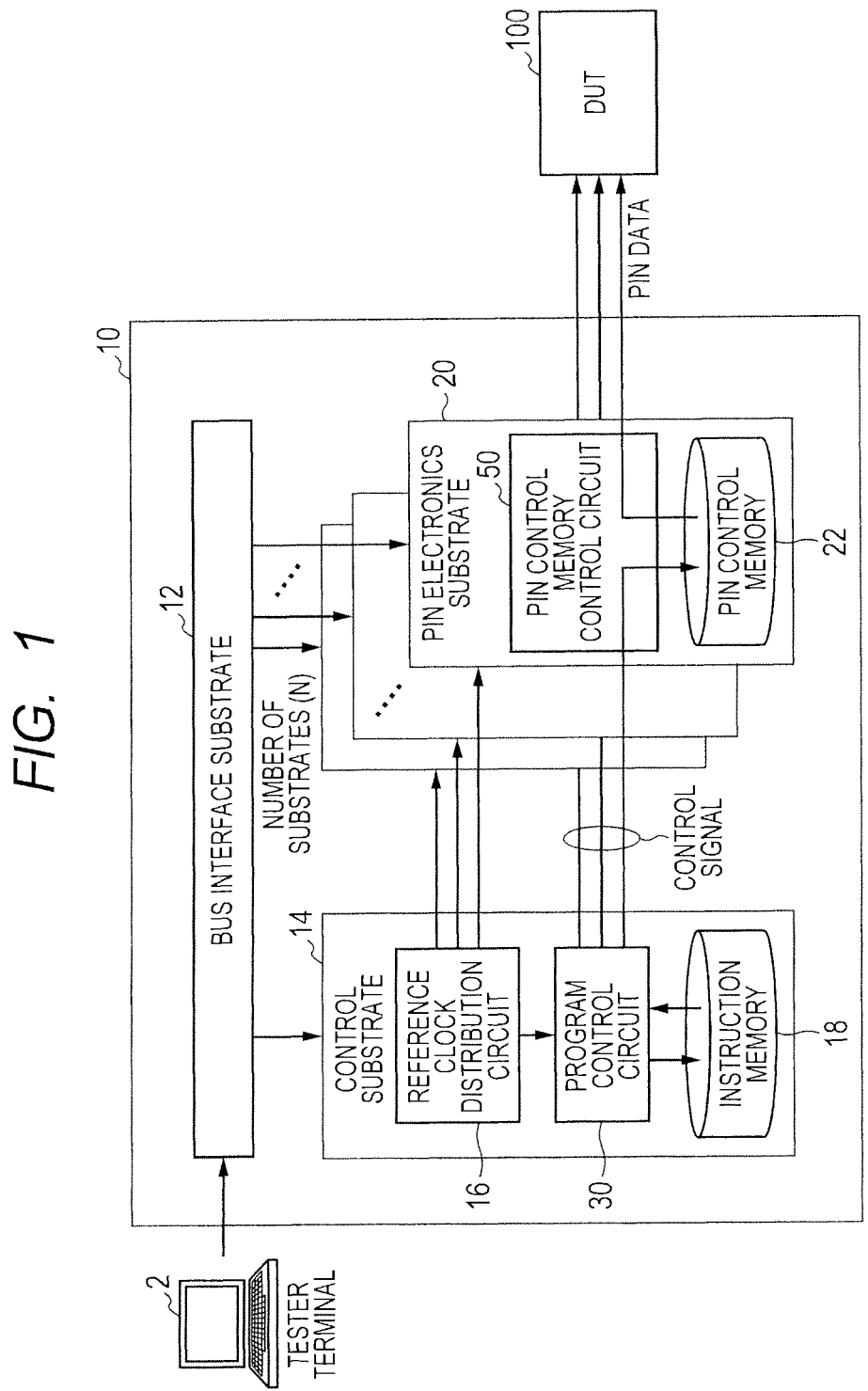
FIG. 1 is a schematic diagram for explaining the configuration of a testing device according to an embodiment of the present invention.

An embodiment of the present invention will be described in detail with reference to drawings. In the drawings referred to in the following, like parts will be denoted by like reference numerals and description will not be repeated for such like parts.

FIG. 1 is a schematic diagram for explaining the configuration of a testing device according to the present embodiment. Referring to FIG. 1, a testing device 10 of the present embodiment can have a prescribed test pattern inputted from a tester terminal 2.

After the testing device 10 is set to be ready for testing by the tester terminal 2, the testing device 10 executes testing of a device under test 100 using a predetermined test pattern.

The testing device 10 includes a bus interface substrate 12, a control substrate 14, and pin electronics substrates 20 for controlling individual pins, respectively.

Whereas the control substrate 14 is a single substrate, there are plural (as many as N) pin electronics substrates 20.

The control substrate 14 controls all the pin electronics substrates 20 together. The bus interface substrate 12 is coupled to the tester terminal 2 and receives a prescribed test pattern from the tester terminal 2.

To be concrete, instruction codes for executing a prescribed test-pattern program received from the tester terminal 2 via the bus interface substrate 12 are stored into an instruction memory 18. Also, pin data making up the prescribed test pattern is stored in a pin control memory 22 included in each of the pin electronics substrates 20 corresponding to the individual pins, respectively.

The control substrate 14 generates a reference clock and includes a reference clock distribution circuit 16, a program control circuit 30, and the instruction memory 18. In the present example, each circuit included in the control substrate 14 and pin electronics substrates 20 operates in synchronization with the reference clock.

The instruction memory 18 and the pin control memory 22 of each pin electronics substrate 20 store instruction codes and pin data, corresponding to program counter values (hereinafter also referred to as "PC values"), from the tester terminal 2 via the bus interface substrate 12.

The program control circuit 30 reads instruction codes from the instruction memory 18 and outputs control signals based on the instruction codes to the pin electronics substrates 20.

In the present example, the control substrate 14 does not output any PC value to the pin electronics substrates 20. It outputs control signals based on instruction codes.

The pin electronics substrates 20 each include a pin control memory control circuit 50 and the pin control memory 22.

In each pin electronics substrate 20, the pin control memory control circuit 50 accesses the pin control memory 22 to read pin data stored therein and outputs the pin data to a device under test 100.

As many pins of the device under test 100 as the number of the pin electronics substrates 20 can be tested simultaneously.

Figure 2:
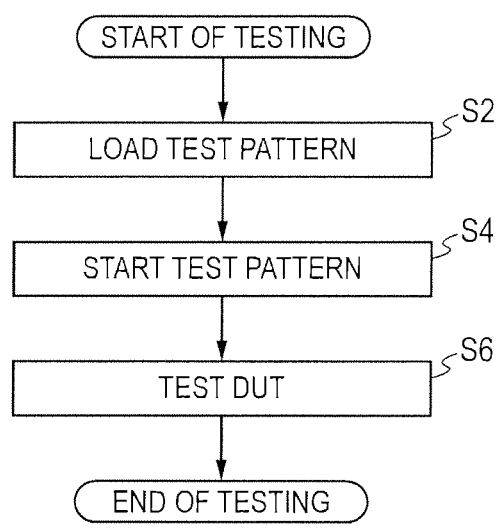
FIG. 2 is a flowchart for explaining testing operation according to the embodiment.

FIG. 2 is a flowchart for explaining testing operation according to the present embodiment. Referring to FIG. 2, first, a test pattern is loaded (step S2). To be concrete, a prescribed test pattern is divided into instruction codes defining vector progress control (program) and pin codes comprised of pin data. The instruction codes and pin codes are written, in association with PC values, to the instruction memory 18 and the pin control memories 22 via the bus interface substrate 12. The data stored in each pin control memory 22 is a portion of the pin codes (a group of data for each pin).

Next, the test pattern is started (step S4). To be concrete, the initial value of the prescribed test pattern is set in a program counter included in the program control circuit 30, and a PC start signal is outputted to the program control circuit 30 via the bus interface substrate 12.

The device under test is tested (step S6). To be concrete, in the present example, an instruction code dependent on the prescribed test pattern is read from the instruction memory 18 and a four-bit control signal is outputted to each pin electronics substrate 20. In the pin control memory control circuit 50 of each pin electronics substrate 20, the PC value is adjusted in accordance with the four-bit control signal and data dependent on the PC value is outputted as pin data to the device under test so as to test the device under test.

Figure 3:
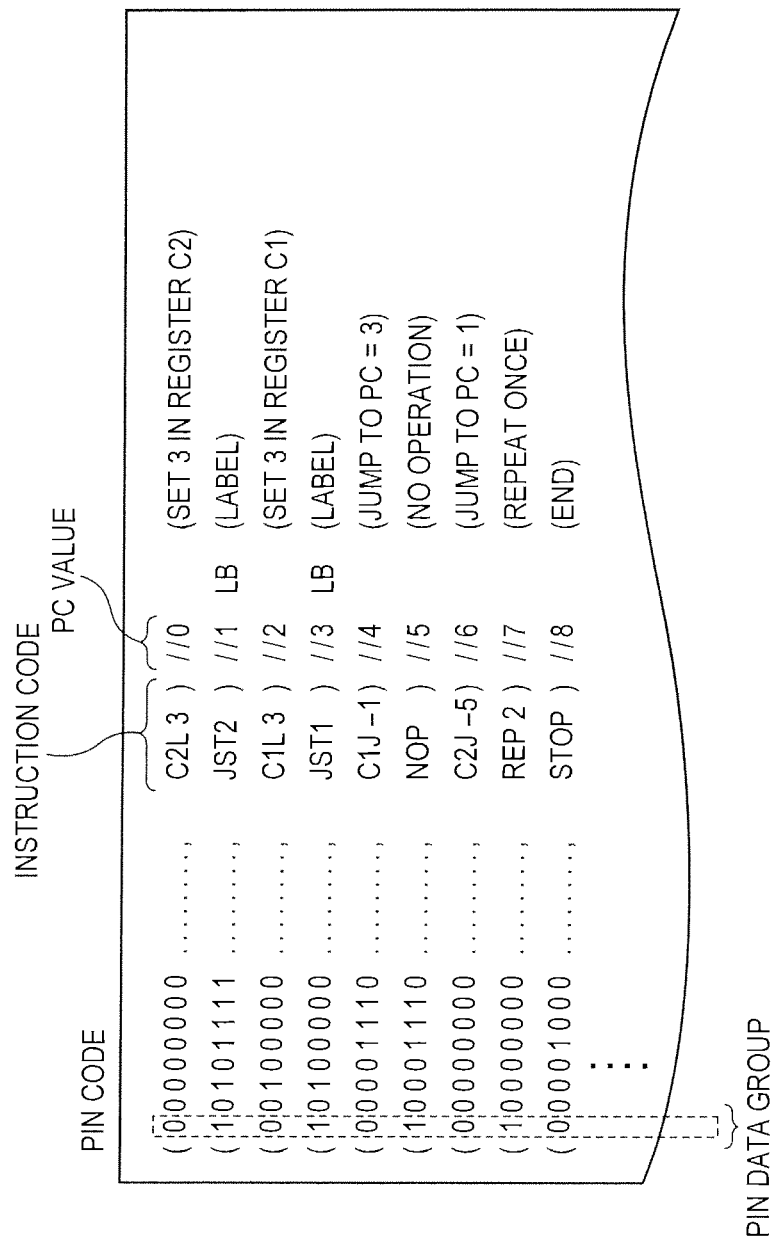
FIG. 3 is a diagram for explaining an example of prescribed test pattern according to the embodiment.

When testing based on the prescribed test pattern of the device under test is completed, testing operation is ended. FIG. 3 is a diagram for explaining an example of prescribed test pattern according to the present embodiment.

FIG. 3 shows a test pattern including instruction codes and pin codes associated with each other.

The instruction codes listed as examples in FIG. 3 are to operate in accordance with PC values 0 to 8. These instruction codes associated with the PC values are stored in the instruction memory 18.

The pin codes are divided into pin data groups each of which corresponds to a pin, and each pin data group is stored in the pin control memory 22 of the corresponding pin electronics substrate.

As an example of pin data group, a pin data group of "010101010" to be outputted in accordance with PC values 0 to 8 is denoted by a broken-line frame in FIG. 3.

Also, in FIG. 3, the operation to be caused by each instruction code is described in parentheses.

FIG. 4 shows a table for explaining instruction codes according to the present embodiment.

Referring to FIG. 4, in the present example, the instruction codes are represented in hexadecimal notation.

In FIG. 4, hexadecimal notations of such instruction codes as "NOP" (advance to next processing), "REP 2" (repetition), "STOP" (stopping), and "C1J-1" (jumping) are listed.

The instruction codes listed in FIG. 3 will be described below.

Referring to FIG. 3, instruction codes to be accompanied by an argument are each coded together with such an argument. In the present example, a high-order value of each of such codes represents an instruction code itself with a low-order value representing an argument.

Instruction codes "C1L 3" and "C2L 3" instruct to set "3" in a loop register (register C1 and register C2), respectively. The loop register will be described later.

Instruction codes "JST1" and "JST2" instruct to register their arguments as labels specifying jump destination addresses for jump processing being described later.

Instruction code "C1J-1" instructs to jump to the immediately preceding PC value.

Instruction code "C2J-5" instructs to jump to the fifth preceding PC value.

Instruction code "NOP" instructs to advance to next processing without performing any operation.

Instruction code "REP 2" instructs to repeat processing.

Instruction code "STOP" instructs to stop processing.

The test pattern shown in FIG. 3 includes double-loop jump processing.

Figure 5:
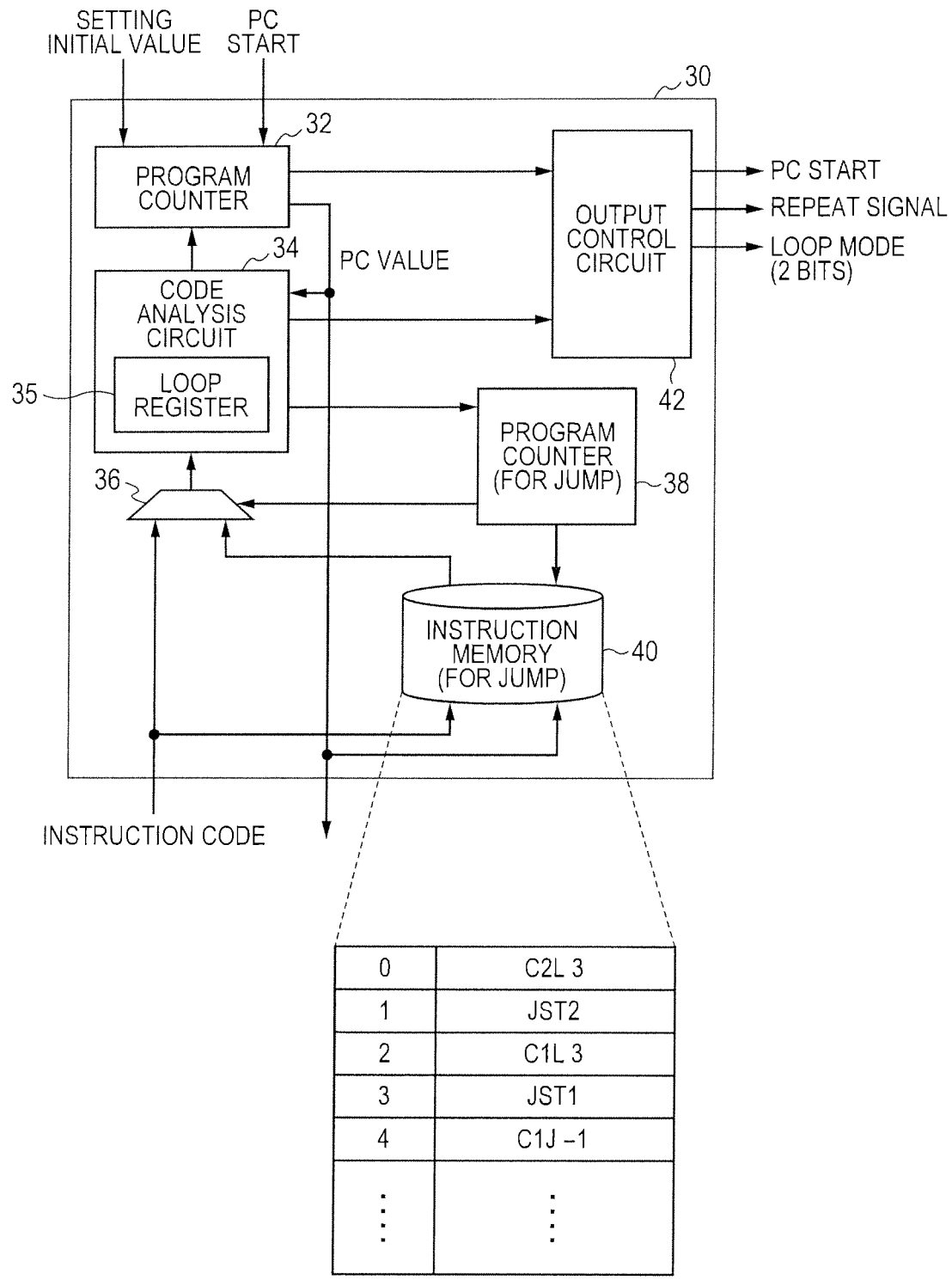
FIG. 5 is a schematic block diagram for explaining the functions of a program control circuit 30 according to the embodiment.

FIG. 5 is a schematic block diagram for explaining the functions of the program control circuit 30 according to the present embodiment.

Referring to FIG. 5, the program control circuit 30 includes a program counter 32, a code analysis circuit 34, a selector 36, a program counter (for jump) 38, an instruction memory (for jump) 40, and an output control circuit 42. The code analysis circuit 34 includes a loop register 35 which includes, in the present example, registers C1 and C2. The registers C1 and C2 specify the numbers of loops (repetitions) of jump processing.

These circuits operate, though not illustrated, in synchronization with the reference clock distributed by the reference clock distribution circuit 16.

First, an initial value is set in the program counter 32 and, when a PC start signal is inputted, the program counter 32 starts operation to increment the PC value in synchronization with the reference clock. The PC value is given to the instruction memory 18 causing the instruction code corresponding to the PC value to be read out.

The instruction code thus read out is inputted to the selector 36 and, at the same time, is stored, in association with the PC value, in the instruction memory (for jump) 40.

Also, when the PC start signal is received, the program counter 32 instructs the output control circuit 42 to output the PC start signal to the pin control memory control circuit 50 of each pin electronics substrate 20.

Except when it is engaged in jump processing, the selector 36 outputs the instruction code read from the instruction memory 18 to the code analysis circuit 34. When it is engaged in jump processing, the selector 36 outputs the instruction code read from the instruction memory (for jump) 40 to the code analysis circuit 34.

The code analysis circuit 34 analyzes the instruction code inputted thereto and performs the operational processing in accordance with the instruction code.

To be concrete, when the instruction code is determined to be a jump instruction by the code analysis made by the code analysis circuit 34, the code analysis circuit 34 gives an instruction related with jump processing to the output control circuit 42 and makes the program counter (for jump) 38 operate. The program counter (for jump) 38 outputs the PC value during jump processing in synchronization with the reference clock. In response to this, the instruction code is read from the instruction memory (for jump) 40 and is inputted to the code analysis circuit 34 via the selector 36.

The code analysis circuit 34 repeats the jump processing as many times as the number specified by the loop register 35.

The output control circuit 42 outputs a control signal to each pin electronics substrate 20 in accordance with the instruction from the code analysis circuit 34 or the program counter 32.

To be concrete, the PC start signal is outputted to the pin control memory control circuit 50 of each pin electronics substrate 20. In the case of repeat processing, the output control circuit 42 outputs a repeat signal. It also outputs a two-bit loop mode signal related with jump processing. As being described later, the two-bit loop mode signal is used as a label signal, a jump start signal, or a jump end signal in the pin electronics substrates 20.

In the present example, instruction codes associated with PC values are stored in the instruction memory (for jump) 40.

Figure 6:
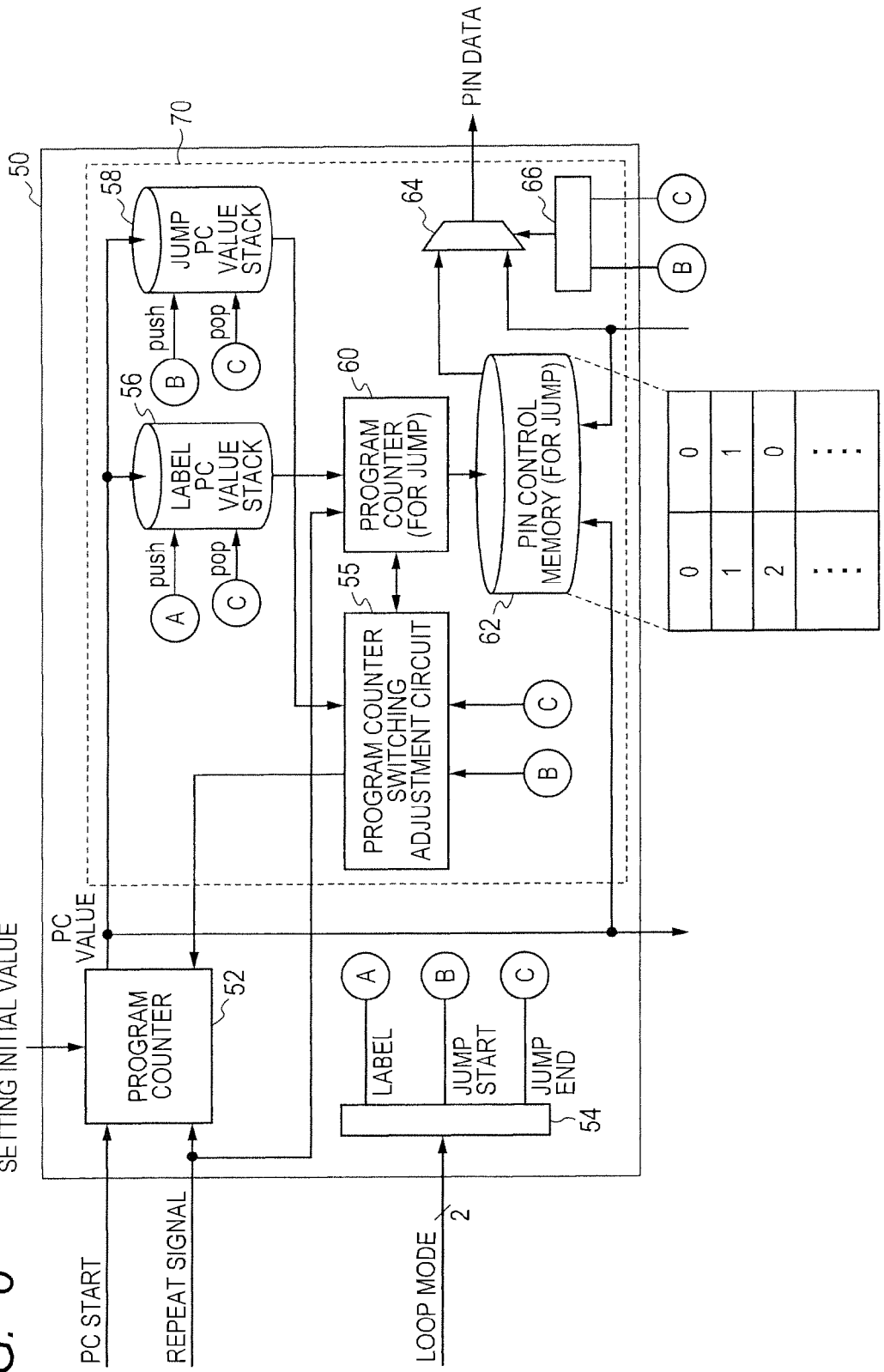
FIG. 6 is a schematic block diagram for explaining the functions of a pin control memory control circuit 50 according to the embodiment.

FIG. 6 is a schematic block diagram for explaining the functions of the pin control memory control circuit 50 included in each pin electronics substrate 20 according to the present embodiment.

Referring to FIG. 6, the pin control memory control circuit 50 includes a program counter 52, a signal generation circuit 54, a program counter switching adjustment circuit 55, a label PC value stack 56, and a jump PC value stack 58. The pin control memory control circuit 50 further includes a program counter (for jump) 60, a pin control memory (for jump) 62, a selector 64, and a selector control circuit 66.

The program counter 52 has an initial value set therein and starts operating when a PC start signal is inputted thereto. It increments the PC value in synchronization with a reference clock distributed by the reference clock distribution circuit 16. The PC value is given to the pin control memory 22 causing the pin data corresponding to the PC value to be read out.

The pin data thus read out is outputted to a DUT 100 via the selector 64 and, at the same time, is stored, in association with the PC value, in the pin control memory (for jump) 62.

Except during jump processing, the selector 64 outputs the pin data read from the pin control memory 22 to outside (the DUT 100). During jump processing, the selector 64 outputs the pin data read from the pin control memory (for jump) 62 to outside (the DUT 100).

The selector control circuit 66 controls the selector 64. When a jump start signal B is received, the selector control circuit 66 switches the input signal route for the selector 64 to the pin control memory (for jump) 62 side causing the pin data from the pin control memory (for jump) 62 to be outputted to outside. When a jump end signal C is received, the selector control circuit 66 switches the input signal route for the selector 64 to the pin control memory 22 side. When, after switching the input signal route to the pin control memory (for jump) 62 side in accordance with a jump start signal B, a jump start signal B is received again, the selector control circuit 66 does not switch the input signal route back to the pin control memory 22 side until a jump end signal C is received twice. Namely, to cancel the jump start signals B inputted to the selector 64 and initialize the input signal route selection to the pin control memory 22 side, as many jump end signals C are required to be inputted to the selector control circuit 66.

The program counter switching adjustment circuit 55 controls switching between the program counter 52 and the program counter (for jump) 60 that are used based on jump processing.

The program counter (for jump) 60 outputs the PC value during jump processing in synchronization with the reference clock. In response to this, the pin data is read from the pin control memory (for jump) 62 and is outputted to outside via the selector 64.

The label PC value stack 56 is a first-in, last-out stack. It stores a PC value in accordance with a label signal A (PUSH) and outputs a PC value in accordance with a jump end signal C (POP). In read operation, the last stacked PC value is read. The label PC value stack 56 stores PC values representing jump destination addresses.

The jump PC value stack 58 is a first-in, last-out stack. It stores a PC value in accordance with a jump start signal B (PUSH) and outputs a PC value in accordance with a jump end signal C (POP). In read operation, the last stacked PC value is read. The jump PC value stack 58 stores PC values for jump processing. The PC value read from the jump PC value stack 58 is compared with the PC value of the program counter (for jump) 60. When they coincide, the PC value that represents a jump destination address and that is stored in the label PC value stack 56 is read out.

In FIG. 6, example pin data stored, in association with PC values, in the pin control memory (for jump) 62 is shown.

Figure 7:
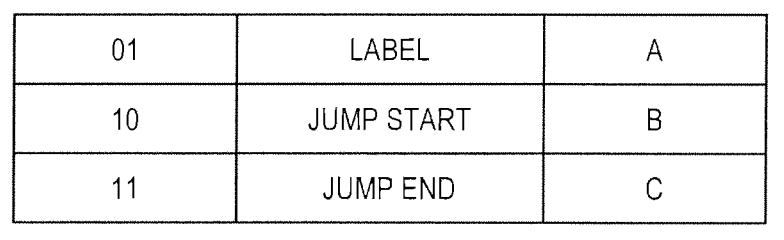

FIG. 7 is a table for explaining loop mode signals inputted to the signal generation circuit 54 according to the present embodiment.

In FIG. 7, example relationships between loop mode signals and signals outputted from the signal generation circuit 54 are shown.

To be concrete, when loop mode signal "01" is received, the signal generation circuit 54 outputs a label signal A.

When loop mode signal "10" is received, the signal generation circuit 54 outputs a jump start signal B.

When loop mode signal "11" is received, the signal generation circuit 54 outputs a jump end signal C.

In the pin control memory control circuit 50 of each pin electronics substrate 20, the PC value is adjusted in accordance with the signals corresponding to the loop mode signals.

Figure 8:
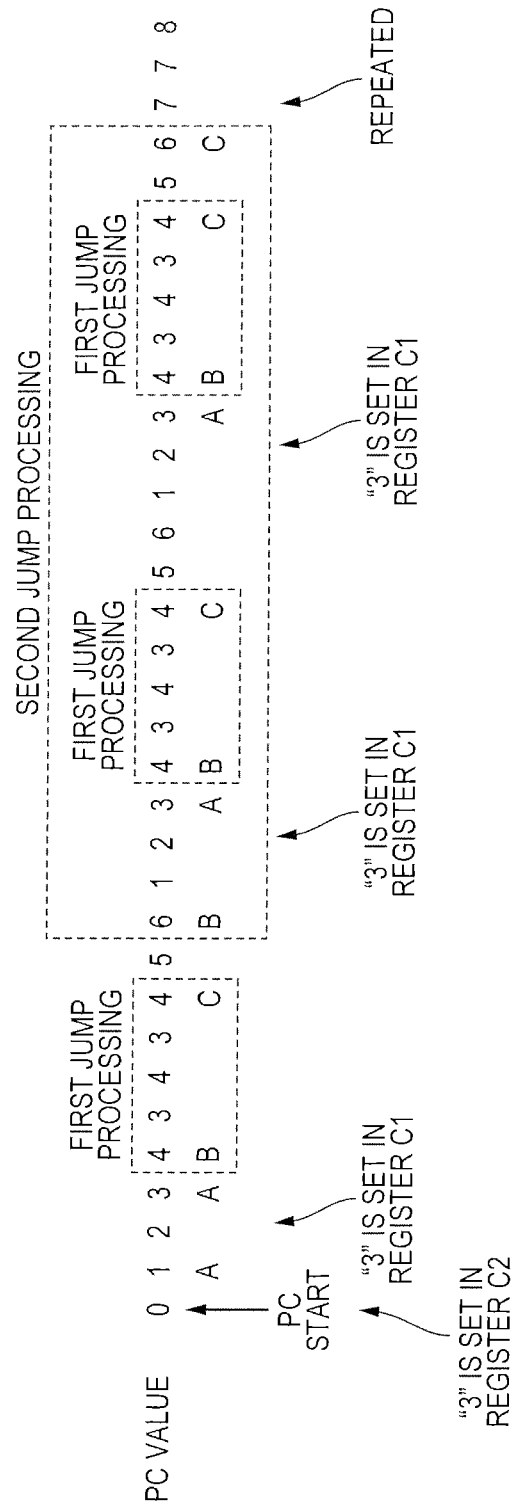
FIG. 8 is a sequence diagram for explaining an outline of a test pattern flow according to the embodiment.

FIG. 8 is a sequence diagram for explaining an outline of a test pattern flow according to the present embodiment.

In FIG. 8, processing performed on the control substrate 14 side is illustrated.

When a PC start signal is inputted, the PC value of the program counter 32 is outputted. In the present example, the initial PC value is assumed to be 0. In accordance with the PC value "0", instruction code "C2L 3" is read out. In accordance with the instruction code, the code analysis circuit 34 sets "3" in register C2 included in the loop register 35. Also, the instruction code is stored, in association with the PC value, in the instruction memory (for jump) 40.

The PC value of the program counter 32 is incremented to "1" in synchronization with the reference clock. In accordance with the PC value "1", instruction code "JST2" is read out. In accordance with the instruction code, the code analysis circuit 34 instructs the output control circuit 42 to output loop mode signal "01" for having label processing performed. The instruction code is stored, in association with the PC value, in the instruction memory (for jump) 40.

Next, the PC value of the program counter 32 is incremented to "2" in synchronization with the reference clock. In accordance with the PC value "2", instruction code "C1L 3" is read out. In accordance with the instruction code, the code analysis circuit 34 sets "3" in register C1 included in the loop register 35. The instruction code is stored, in association with the PC value, in the instruction memory (for jump) 40.

Next, the PC value of the program counter 32 is incremented to "3" in synchronization with the reference clock. In according with the PC value "3", instruction code "JST1" is read out. In accordance with the instruction code, the code analysis circuit 34 instructs the output control circuit 42 to output loop mode signal "01" for having label processing performed. The instruction code is stored, in association with the PC value, in the instruction memory (for jump) 40.

Next, the PC value of the program counter 32 is incremented to "4" in synchronization with the reference clock. In accordance with the PC value "4", instruction code "C1J-1" is read out. In accordance with the instruction code, the value in register C1 included in the loop register 35 is decrement from "3" to "2". Since the value in register C1 is not "0", the code analysis circuit 34 performs jump processing. To be concrete, the code analysis circuit 34 instructs the program counter 32 to stop increment operation. The code analysis circuit 34 also sets "3", i.e. the current PC value less 1, in the program counter (for jump) 38. Furthermore, the code analysis circuit 34 instructs the output control circuit 42 to output loop mode signal "10" for having jump processing started. As a result, the first jump processing is performed.

Next, the PC value of the program counter (for jump) 38 is outputted in synchronization with the reference clock. In accordance with the PC value "3", instruction code "JST1" is read from the instruction memory (for jump) 40. In the present example, the code analysis circuit 34 does not perform the processing specified by the instruction code corresponding to the PC value of the jump destination. Namely, the code analysis circuit 34 does not instruct the output control circuit 42 to output loop mode signal "01" for having label processing performed.

Next, the PC value of the program counter (for jump) 38 is incremented to "4" in synchronization with the reference clock. In accordance with the PC value "4", instruction code "C1J-1" is read out. In accordance with the instruction code, the value in register C1 is decremented from "2" to "1". Since the value in register C1 is not "0", the code analysis circuit 34 performs jump processing. The code analysis circuit 34 sets "3", i.e. the current PC value less 1, in the program counter (for jump) 38. In the present example, the code analysis circuit 34 does not perform the processing specified by an instruction code corresponding to a jump instruction issued while identical jump processing is being performed. Namely, the code analysis circuit 34 does not instruct the output control circuit 42 to output loop mode signal "10" for having jump processing started.

Next, the PC value of the program counter (for jump) 38 is outputted in synchronization with the reference clock. In accordance with the PC value "3", instruction code "JST1" is read out. In the present example, the code analysis circuit 34 does not perform the processing specified by an instruction code corresponding to the PC value of a jump destination. Namely, the code analysis circuit 34 does not instruct the output control circuit 42 to output loop mode signal "01" for having label processing performed.

Next, the PC value of the program counter (for jump) 38 is incremented to "4" in synchronization with the reference clock. In accordance with the PC value "4", instruction code "C1J-1" is read out. In accordance with the instruction code, the value in register C1 is decremented from "1" to "0". Since the value in register C1 is "0", the jump processing is ended. To be concrete, the code analysis circuit 34 instructs the program counter 32 to resume operation while instructing the program counter (for jump) 38 to stop operation. Also, with the value in register C1 being "0", the code analysis circuit 34 instructs the output control circuit 42 to output loop mode signal "11" for having the jump processing ended. As a result, the first jump processing is ended.

Next, the PC value of the program counter 32 is incremented to "5" in synchronization with the reference clock. In accordance with the PC value "5", instruction code "NOP" is read out. This instruction code causes no operation to be performed. Processing advances to the next step.

Next, the PC value of the program counter 32 is incremented to "6" in synchronization with the reference clock. In accordance with the PC value "6", instruction code "C2J-5" is read out. In accordance with the instruction code, the value in register C2 is decremented from "3" to "2". Since the value in register C2 is not "0", the code analysis circuit 34 performs jump processing. To be concrete, the code analysis circuit 34 instructs the program counter 32 to stop operation. The code analysis circuit 34 also sets "1", i.e. the current PC value less 5, in the program counter (for jump) 38. Furthermore, the code analysis circuit 34 instructs the output control circuit 42 to output loop mode signal "10" for having jump processing started. As a result, the second jump processing is performed.

Next, the PC value of the program counter (for jump) 38 is outputted in synchronization with the reference clock. In accordance with the PC value "1", instruction code "JST2" is read out. In the present example, the code analysis circuit 34 does not perform the processing specified by an instruction code corresponding to the PC value of a jump destination. Namely, the code analysis circuit 34 does not instruct the output control circuit 42 to output loop mode signal "01" for having label processing performed.

Next, the PC value of the program counter (for jump) 38 is incremented to "2" in synchronization with the reference clock. In accordance with the PC value "2", instruction code "CU, 3" is read out. In accordance with the instruction code, the code analysis circuit 34 sets "3" in register C1.

Next, the PC value of the program counter (for jump) 38 is incremented to "3" in synchronization with the reference clock. In accordance with the PC value "3", instruction code "JST1" is read out. In accordance with the instruction code, the code analysis circuit 34 instructs the output control circuit 42 to output loop mode signal "01" for having label processing performed.

Next, the PC value of the program counter (for jump) 38 is incremented to "4" in synchronization with the reference clock. In accordance with the PC value "4", instruction code "C1J-1" is read out. In accordance with the instruction code, the value in register C1 included in the loop register 35 is decremented from "3" to "2". Since the value in register C1 is not "0", the code analysis circuit 34 performs jump processing. The code analysis circuit 34 also sets "3", i.e. the current PC value less 1, in the program counter (for jump) 38. Furthermore, the code analysis circuit 34 instructs the output control circuit 42 to output loop mode signal "10" for having jump processing started. As a result, the first jump processing is performed. Subsequently, the first jump processing is repeated until the value in register C1 becomes "0".

The PC value of the program counter (for jump) 38 is incremented to "4" in synchronization with the reference clock. In accordance with the PC value "4", instruction code "C1J-1" is read out. In accordance with the instruction code, the code analysis circuit 34 decrements the value in register C1 and, when the value becomes "0", ends the jump processing. To be concrete, the code analysis circuit 34 instructs the output control circuit 42 to output loop mode signal "11" for having the jump processing ended. As a result, the first jump processing is ended.

Next, the PC value of the program counter (for jump) 38 is incremented to "5" in synchronization with the reference clock. In accordance with the PC value "5", instruction code "NOP" is read out. This instruction code causes no operation to be performed. Processing advances to the next step.

Next, the PC value of the program counter (for jump) 38 is incremented to "6" in synchronization with the reference clock. In accordance with the PC value "6", instruction code "C2J-5" is read out. In accordance with the instruction code, the value in register C2 is decremented from "2" to "1". Since the value in register C2 is not "0", the code analysis circuit 34 performs jump processing. The code analysis circuit 34 sets "1", i.e. the current PC value less 5, in the program counter (for jump) 38. As described in the foregoing, the code analysis circuit 34 does not perform the processing specified by the instruction code corresponding to a jump instruction issued while identical jump processing is being performed. Namely, the code analysis circuit 34 does not instruct the output control circuit 42 to output loop mode signal "10" for having jump processing started.

Next, the PC value of the program counter (for jump) 38 is outputted in synchronization with the reference clock. In accordance with the PC value "1", instruction code "JST2" is read out. In the present example, the code analysis circuit 34 does not perform the processing specified by an instruction code corresponding to the PC value of a jump destination. Namely, the code analysis circuit 34 does not instruct the output control circuit 42 to output loop mode signal "01" for having label processing performed.

Next, the PC value of the program counter (for jump) 38 is outputted in synchronization with the reference clock. In accordance with the PC value "2", instruction code "CU, 3" is read out. In accordance with the instruction code, the code analysis circuit 34 sets "3" in register C1.

Next, the PC value of the program counter (for jump) 38 is incremented to "3" in synchronization with the reference clock. In accordance with the PC value "3", instruction code "JST1" is read out. In accordance with the instruction code, the code analysis circuit 34 instructs the output control circuit 42 to output loop mode signal "01" for having label processing performed.

Next, the PC value of the program counter (for jump) 38 is incremented to "4" in synchronization with the reference clock. In accordance with the PC value "4", instruction code "C1J-1" is read out. In accordance with the instruction code, the value in register C1 included in the loop register 35 is decremented from "3" to "2". Since the value in register C1 is not "0", the code analysis circuit 34 performs jump processing. The code analysis circuit 34 sets "3", i.e. the current PC value less 1, in the program counter (for jump) 38. Also, the code analysis circuit 34 instructs the output control circuit 42 to output loop mode signal "10" for having jump processing started. As a result, the first jump processing is performed. Subsequently, the first jump processing is repeated until the value in register C1 becomes "0".

The PC value of the program counter (for jump) 38 is incremented to "4" in synchronization with the reference clock. In accordance with the PC value "4", instruction code "C1J-1" is readout. In accordance with the instruction code, the code analysis circuit 34 decrements the value in register C1 and, when the values becomes "0", ends the jump processing. To be concrete, the code analysis circuit 34 instructs the output control circuit 42 to output loop mode signal "11" for having the jump processing ended. As a result, the first jump processing is ended.

Next, the PC value of the program counter (for jump) 38 is incremented to "5" in synchronization with the reference clock. In accordance with the PC value "5", instruction code "NOP" is read out. This instruction code causes no operation to be performed. Processing advances to the next step.

Next, the PC value of the program counter (for jump) 38 is incremented to "6" in synchronization with the reference clock. In accordance with the PC value "6", instruction code "C2J-5" is read out. In accordance with the instruction code, the value in register C2 is decremented from "1" to "0". Since the value in register C2 is "0", the code analysis circuit 34 ends the jump processing. To be concrete, the code analysis circuit 34 instructs the output control circuit 42 to output loop mode signal "11" for having the jump processing ended. As a result, the second jump processing is ended.

Next, the PC value of the program counter 32 is incremented to "7" in synchronization with the reference clock. In accordance with the PC value "7", instruction code "REP 2" is read out. In accordance with the instruction code, the code analysis circuit 34 instructs the program counter 32 to output the same PC value. The code analysis circuit 34 instructs the output control circuit 42 to output a repeat signal for having repeat processing performed.

Next, PC value "7" of the program counter 32 is outputted in synchronization with the reference clock. Then, the PC value of the program counter 32 is incremented to "8" in synchronization with the reference clock. In accordance with the PC value "8", instruction code "STOP" is read out. In accordance with the instruction code, the testing operation is ended.

FIGS. 9A to 9C are diagrams for explaining internal states of the instruction memory (for jump) 40 according to the present embodiment.

FIG. 9A illustrates a case in which instruction codes are stored in accordance with the varying PC value of the program counter 32.

The first jump processing is performed in accordance with the PC value "4". At this time, each instruction code is read out by accessing not the instruction memory 18 but the instruction memory (for jump) 40. The jump processing is repeated until the value in register C1 becomes "0".

FIG. 9B illustrates a case in which more instruction codes are stored in accordance with the varying PC value of the program counter 32.

The second jump processing is performed in accordance with the PC value "6". At this time, each instruction code is read out by accessing not the instruction memory 18 but the instruction memory (for jump) 40. The jump processing is repeated until the value in register C2 becomes "0". In this case, the second jump processing includes the first jump processing, making up double-loop processing.

FIG. 9C illustrates a case in which still more instruction codes are stored in accordance with the varying PC value of the program counter 32.

The testing operation is ended in accordance with the PC value "8".

In the jump processing of the present example, instruction codes for jump processing are read by accessing the instruction memory (for jump) 40 provided in the program control circuit 30. This enables faster processing than by accessing the instruction memory 18.

Figure 10:
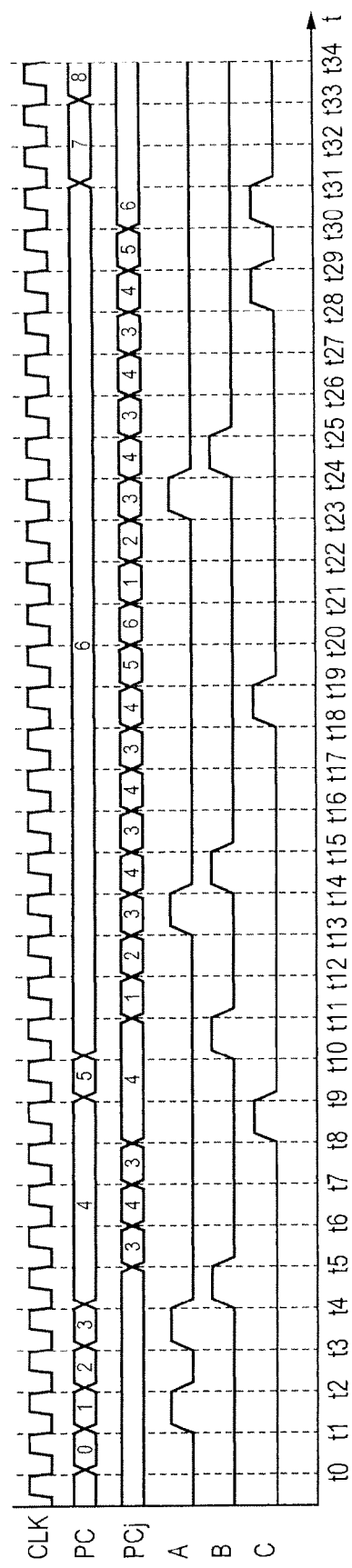
FIG. 10 is a diagram for explaining changes in the PC value outputted based on a reference clock according to the embodiment.

FIG. 10 is a diagram for explaining changes in the PC value outputted based on the reference clock according to the present embodiment.

Referring to FIG. 10, the PC value of the program counter 32 becomes "0" at time t0 in synchronization with the reference clock. Next, at time t1, the PC value becomes "1". In response to this, loop mode signal "01" for generating a label signal A based on the instruction code corresponding to the PC value "1" is outputted. At time t2, the PC value becomes "2". At time t3, the PC value becomes "3". In response to this, loop mode signal "01" for generating a label signal A based on the instruction code corresponding to the PC value "3" is outputted. At time t4, the PC value becomes "4". In response to this, loop mode signal "10" for generating a jump start signal B based on the instruction code corresponding to the PC value "4" is outputted. As a result, the first jump processing is started.

At time t5, the program counter (for jump) 38 outputs PC value "3". In FIG. 10, the PC value of the program counter (for jump) 38 is denoted by "PCj". The first jump processing is repeated as described above.

At time t8, the value in register C1 is updated to "0" based on the instruction code corresponding to the PC value "4". In response to this, loop mode signal "11" for generating a jump end signal C is outputted. As a result, the first jump processing is ended.

At time t9, the PC value of the program counter 32 becomes "5" in synchronization with the reference clock.

At time t10, loop mode signal "10" for generating a jump start signal based on the instruction code corresponding to the PC value "6" is outputted. As a result, the second jump processing is started.

At time t11, the program counter (for jump) 38 outputs PC value "1".

At time t13, loop mode signal "01" for generating a label signal A based on the instruction code corresponding to the PC value "3" is outputted.

At time t14, the PC value becomes "4". In response to this, loop mode signal "10" for generating a jump start signal B based on the instruction code corresponding to the PC value "4" is outputted. As a result, the first jump processing is started.

At time t15, the program counter (for jump) 38 outputs PC value "3". The first jump processing is repeated as described above.

At time t18, the value in register C1 is updated to "0" based on the instruction code corresponding to the PC value "4". In response to this, loop mode signal "11" for generating a jump end signal C is outputted. As a result, the first jump processing is ended. At this time, the second jump processing is still continuing.

At time t23, the PC value becomes "3". In response to this, loop mode signal "01" for generating a label signal A based on the instruction code corresponding to the PC value "3" is outputted. At time t24, the PC value becomes "4". In response to this, loop mode signal "10" for generating a jump start signal B based on the instruction code corresponding to the PC value "4" is outputted. As a result, the first jump processing is started.

At time t25, PC value "3" is outputted. The first jump processing is repeated as described above.

At time t28, the value in register C1 is updated to "0" based on the instruction code corresponding to the PC value "4". In response to this, loop mode signal "11" for generating a jump end signal C is outputted. As a result, the first jump processing is ended. At this time, the second jump processing is still continuing.

At time t30, the value in register C2 is updated to "0" based on the instruction code corresponding to the PC value "6". In response to this, loop mode signal "11" for generating a jump end signal C is outputted. As a result, the second jump processing is ended.

At time t31, the PC value of the program counter 32 becomes "7" in synchronization with the reference clock. A repeat signal is outputted based on the instruction code corresponding to the PC value "7".

At time t32, the PC value of the program counter 32 becomes "7" in synchronization with the reference clock.

At time t33, the PC value of the program counter 32 becomes "8" in synchronization with the reference clock.

As a result, the processing is ended.

FIG. 11 is a first diagram for explaining the pin data dependent on the PC value on the pin electronics substrate 20 side according to the present embodiment.

Referring to FIG. 11, first, when the PC value on the control substrate 14 side (hereinafter may also be referred to simply as "the control side") is "0", the PC value outputted on the pin electronics substrate 20 side (hereinafter may also be referred to simply as "the pin side") is also "0". Responding to the PC value "0", the pin control memory 22 outputs pin data "0". Both on the control substrate 14 side and on the pin electronics substrate 20 side, the PC values are outputted in synchronization with the reference clock.

Next, when the PC value on the control side is "1", the PC value outputted on the pin side is also "1". Responding to the PC value "1", the pin control memory 22 outputs pin data "1". Also, loop mode signal "01" representing a label instruction is outputted from the control side based on the instruction code. As a result, a label signal A is generated and PC value "1" is stored in the label PC value stack 56 (PUSH).

Next, when the PC value on the control side is "2", the PC value outputted on the pin side is also "2". Responding to the PC value "2", the pin control memory 22 outputs pin data "0".

Next, when the PC value on the control side is "3", the PC value outputted on the pin side is also "3". Responding to the PC value "3", the pin control memory 22 outputs pin data "1". Also, loop mode signal "01" for having label processing performed is outputted on the control side. As a result, a label signal A is generated and PC value "3" is additionally stored in the label PC value stack 56 (PUSH).

Next, when the PC value on the control side is "4", the PC value outputted on the pin side is also "4". Responding to the PC value "4", the pin control memory 22 outputs pin data "0". Also, loop mode signal "10" for having jump processing started is outputted from the control side. In response to this, a jump start signal B is generated and PC value "4" is stored in the jump PC value stack 58 (PUSH). On both the control side and the pin side, program counter switching is made to the program counter for jump. On the pin side, the program counter switching adjustment circuit 55 makes switching from the program counter 52 to the program counter (for jump) 60 in accordance with the jump start signal B and sets the PC value ("3") stored in the label PC value stack 56 on the program counter (for jump) 60. Also, in accordance with the jump start signal B, the selector control circuit 66 switches the output of the selector 64 to the pin data outputted from the pin control memory (for jump) 62.

Next, when the PC value on the control side is "3", the PC value outputted on the pin side is also "3" (because "3" has been set on the program counter (for jump) 60). Responding to the PC value "3", the pin control memory (for jump) 62 outputs pin data "1".

Next, when the PC value on the control side is "4", the PC value outputted on the pin side is also "4" (because the PC value of the program counter (for jump) 60 has been incremented). Responding to the PC value "4", the pin control memory (for jump) 62 outputs pin data "0". Also, the program counter switching adjustment circuit 55 reads the PC value ("4") stored in the jump PC value stack 58 and compares it with the PC value of the program counter (for jump) 60. Since the two PC values agree with each other, the program counter switching adjustment circuit 55 sets the PC value "3" stored in the label PC value stack 56 on the program counter (for jump) 60.

Next, when the PC value on the control side is "3", the PC value outputted on the pin side is also "3" (because "3" has been set on the program counter (for jump) 60). Responding to the PC value "3", the pin control memory (for jump) 62 outputs pin data "1".

Next, when the PC value on the control side is "4", the PC value outputted on the pin side is also "4" (because the PC value of the program counter (for jump) 60 has been incremented). Responding to the PC value "4", the pin control memory (for jump) 62 outputs pin data "0". Also, loop mode signal "11" for having the jump processing ended is outputted from the control side. In response to this, a jump end signal C is generated and the PC value "3" is removed from the label PC value stack 56 (POP). The program counter switching adjustment circuit 55 makes sure that no PC value is stored in the jump PC value stack 58, then makes switching from the program counter (for jump) 60 to the program counter 52. Also, in accordance with the jump end signal C, the selector control circuit 66 switches the output of the selector 64 to the pin data outputted from the pin control memory 22 (the jump start signal B and the jump end signal C were each inputted once).

Next, when the PC value on the control side is "5", the PC value outputted on the pin side is also "5" (because the PC value of the program counter 52 has been incremented). Responding to the PC value "5", the pin control memory 22 outputs pin data "1".

FIG. 12 is a second diagram for explaining the pin data dependent on the PC value on the pin electronics substrate 20 side according to the present embodiment.

Referring to FIG. 12, when the PC value on the control side is "6", the PC value outputted on the pin side is also "6". Responding to the PC value "6", the pin control memory 22 outputs pin data "0". Also, loop mode signal "10" for having jump processing started is outputted from the control side. In response to this, a jump start signal B is generated and PC value "6" is stored in the jump PC value stack 58 (PUSH). On both the control side and the pin side, program counter switching is made to the program counter for jump. On the pin side, the program counter switching adjustment circuit 55 makes switching from the program counter 52 to the program counter (for jump) 60 in accordance with the jump start signal B and sets the PC value ("1") stored in the label PC value stack 56 on the program counter (for jump) 60. Also, in accordance with the jump start signal B, the selector control circuit 66 switches the output of the selector 64 to the pin data outputted from the pin control memory (for jump) 62.

Next, when the PC value on the control side is "1", the PC value outputted on the pin side is also "1" (because "1" has been set on the program counter (for jump) 60). Responding to the PC value "1", the pin control memory (for jump) 62 outputs pin data "1". Note that, as described above, when the instruction code at the jump destination address is a label, no label signal is generated.

Next, when the PC value on the control side is "2", the PC value outputted on the pin side is also "2" (because the PC value of the program counter (for jump) 60 has been incremented). Responding to the PC value "2", the pin control memory (for jump) 62 outputs pin data "0".

Next, when the PC value on the control side is "3", the PC value outputted on the pin side is also "3" (because the PC value of the program counter (for jump) 60 has been incremented). Responding to the PC value "3", the pin control memory (for jump) 62 outputs pin data "1". Also, loop mode signal "01" corresponding to a label instruction is outputted from the control side. In response to this, a label signal A is generated and PC value "3" is additionally stored in the label PC value stack 56.

Next, when the PC value on the control side is "4", the PC value outputted on the pin side is also "4" (because the PC value of the program counter (for jump) 60 has been incremented). Responding to the PC value "4", the pin control memory (for jump) 62 outputs pin data "0". Also, loop mode signal "10" for having jump processing started is outputted from the control side. In response to this, a jump start signal B is generated, and PC value "4" is stored in the jump PC value stack 58 (PUSH). Responding to the jump start signal B, the program counter switching adjustment circuit 55 sets the PC value ("3") stored in the label PC value stack 56 on the program counter (for jump) 60.

Next, when the PC value on the control side is "3", the PC value outputted on the pin side is also "3" (because the PC value "3" has been set on the program counter (for jump) 60). Responding to the PC value "3", the pin control memory (for jump) 62 outputs pin data "1".

Next, when the PC value on the control side is "4", the PC value outputted on the pin side is also "4" (because the PC value of the program counter (for jump) 60 has been incremented). Responding to the PC value "4", the pin control memory (for jump) 62 outputs pin data "0". Also, the program counter switching adjustment circuit 55 reads the PC value ("4") stored in the jump PC value stack 58 and compares it with the PC value of the program counter (for jump) 60. Since the two PC values agree with each other, the program counter switching adjustment circuit 55 sets the PC value "3" stored in the label PC value stack 56 on the program counter (for jump) 60.

Next, when the PC value on the control side is "3", the PC value outputted on the pin side is also "3" (because the PC value "3" has been set on the program counter (for jump) 60). Responding to the PC value "3", the pin control memory (for jump) 62 outputs pin data "1".

Next, when the PC value on the control side is "4", the PC value outputted on the pin side is also "4" (because the PC value of the program counter (for jump) 60 has been incremented). Responding to the PC value "4", the pin control memory (for jump) 62 outputs pin data "0". Also, loop mode signal "11" for having the jump processing ended is outputted from the control side. In response to this, a jump end signal C is generated, and the PC value "3" is removed from the label PC value stack 56 (POP). Also, in accordance with the jump end signal C, the PC value "4" is removed from the jump PC value stack 58 (POP). With the PC value "6" stored in the jump PC value stack 58, the program counter switching adjustment circuit 55 does not make switching from the program counter (for jump) 60 to the program counter 52. In cases where the jump start signal B has been inputted twice, the selector control circuit 66 resets the jump start signal B and makes switching only when the jump end signal C is inputted twice. In the present case, the jump end signal C has been inputted only once, so that the pin data from the pin control memory (for jump) 62 is outputted without being switched.

Next, when the PC value on the control side is "5", the PC value outputted on the pin side is also "5" (because the PC value of the program counter (for jump) 60 has been incremented). Responding to the PC value "5", the pin control memory (for jump) 62 outputs pin data "1".

Next, when the PC value on the control side is "6", the PC value outputted on the pin side is also "6". Responding to the PC value "6", the pin control memory (for jump) 62 outputs pin data "0". Also, the program counter switching adjustment circuit 55 reads the PC value ("6") stored in the jump PC value stack 58 and compares it with the PC value of the program counter (for jump) 60. Since the two PC values agree with each other, the program counter switching adjustment circuit 55 sets the PC value ("1") stored in the label PC value stack 56 on the program counter (for jump) 60.

When the PC value on the control side is again "1", the PC value outputted on the pin side is also "1" (because the PC value "1" has been set on the program counter (for jump) 60). Subsequently, the processing described above is repeated.

When the PC value on the control side is again "6", the PC value outputted on the pin side is also "6". Responding to the PC value "6", the pin control memory (for jump) 62 outputs pin data "0". Also, loop mode signal "11" for having the jump processing ended is outputted from the control side. In response to this, a jump end signal C is generated, and the PC value "1" is removed from the label PC value stack 56 (POP). Also, in accordance with the jump end signal C, the PC value "6" is removed from the jump PC value stack 58 (POP). The program counter switching adjustment circuit 55 makes sure that no PC value is stored in the jump PC value stack 58, then makes switching from the program counter (for jump) 60 to the program counter 52. Since, for the jump start signal B that has been inputted twice, the jump end signal C has been inputted twice, the selector control circuit 66 resets the jump start signal B and switches the output of the selector 64 to the pin data outputted from the pin control memory 22.

Next, when the PC value on the control side is "7", the PC value outputted on the pin side is also "7" (because the PC value of the program counter 52 has been incremented). Responding to the PC value "7", the pin control memory 22 outputs pin data "1". Also, a repeat signal is outputted from the control side to the pin side. The repeat signal is inputted to the program counter 52.

Next, when the PC value on the control side is "7", the PC value outputted on the pin side is also "7". Responding to the PC value "7", the pin control memory 22 outputs pin data "1".

Next, when the PC value on the control side is "8", the PC value outputted on the pin side is also "8" (because the PC value of the program counter 52 has been incremented). Responding to the PC value "8", the pin control memory 22 outputs pin data "0".

Even though the present example has been described concerning the pin data for one pin electronics substrate, similar processing takes place also for the other pin electronics substrates.

As described above, the pin data corresponding to the PC value on the pin side can be outputted in synchronization with the PC value on the control side.

To be concrete, this is realized by adjusting the PC value on the pin side using a loop mode signal (2 bits) outputted from the program control circuit 30 to control jump processing. Namely, the above processing is performed using the PC start signal (1 bit), repeat signal (1 bit) and loop mode signal (2 bits) totaling four bits.

Therefore, when the number of the pin electronics substrates is, for example, 16, the number of wirings required to perform testing using a prescribed test pattern is 64 (16× 4=64). Thus, compared with existing testing device configurations, the configuration of the present embodiment enables simultaneous testing of multiple pins using a greatly reduced number of wirings.

FIGS. 13A to 13C are diagrams for explaining internal states of the pin control memory (for jump) 62 according to the present embodiment.

FIG. 13A illustrates a case in which pin data is stored in accordance with the PC value of the program counter 52.

In this case, jump operation is performed in accordance with the PC value "4". At this time, pin data is read out by accessing not the pin control memory 22 but the pin control memory (for jump) 62. The jump operation is repeated until a jump end signal C is inputted.

FIG. 13B illustrates a case in which more pin data is stored in accordance with the PC value of the program counter 32.

In this case, jump operation is performed in accordance with the PC value "6". At this time, pin data is read out by accessing not the pin control memory 22 but the pin control memory (for jump) 62. The jump operation is repeated until the jump end signal C is inputted twice.

FIG. 13C illustrates a case in which more pin data is stored in accordance with the PC value of the program counter 32.

In this case, the testing operation is ended in accordance with the PC value "8". In the present example, during jump operation, the pin data dependent on jump operation is read out by accessing the pin control memory (for jump) 62 provided in the pin control memory control circuit 50. This makes processing faster than by accessing the pin control memory 22.

The control performed in the code analysis circuit 34 to perform the above processing will be described below.

Figure 14:
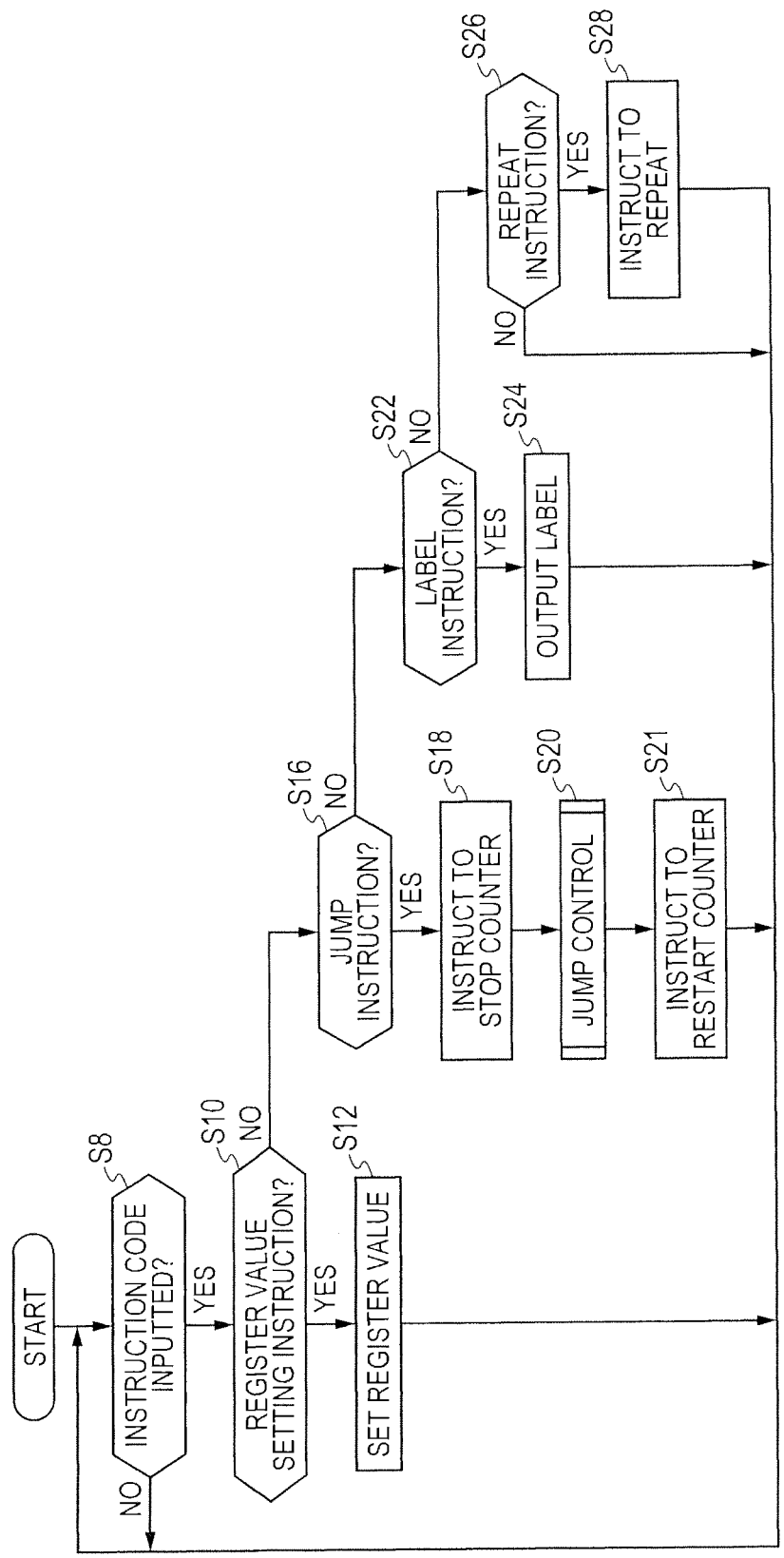
FIG. 14 is a flowchart for explaining the processing performed in a code analysis circuit 34 according to the embodiment.

FIG. 14 is a flowchart for explaining the processing performed in the code analysis circuit 34 according to the present embodiment.

Referring to FIG. 14, the code analysis circuit 34 determines whether or not an instruction code read from the instruction memory 18 in synchronization with the reference clock has been inputted (step S8).

When the code analysis circuit 34 determines in step S8 that an instruction code has been inputted (step S8=YES), it determines whether or not the instruction code is a register value setting instruction ("C1L" or "C2L") (step S10).

When it is determined in step S10 that the instruction code is a register value setting instruction (step S10=YES), the code analysis circuit 34 sets a register value (step S12). To be concrete, the code analysis circuit 34 sets a register value in register C1 or register C2 included in the loop register 35 in accordance with the register value setting instruction.

Processing then returns to step S8.

On the other hand, when it is determined in step S10 that the instruction code is not a register value setting instruction (step S10=NO), the code analysis circuit 34 determines whether or not the instruction code is a jump instruction ("C1J" or "C2J") (step S16).

When it is determined in step S16 that the instruction code is a jump instruction (step S16=YES), the code analysis circuit 34 issues an instruction to stop the program counter 32 (step S18).

Then, the code analysis circuit 34 performs jump control (step S20). The jump control will be described in detail later.

After completion of the jump control, the code analysis circuit 34 issues an instruction to restart the program counter 32 (step S21). Processing then returns to step S8.

When it is determined in step S16 that the instruction code is not a jump instruction (step S16=NO), the code analysis circuit 34 determines whether or not the instruction code is a label instruction ("JST1" or "JST2") (step S22).

When it is determined in step S22 that the instruction code is a label instruction (step S22=YES), the code analysis circuit 34 outputs an instruction for label processing to the output control circuit 42 (step S24). In accordance with the instruction, the output control circuit 42 outputs loop mode signal "01" to the pin control memory control circuit 50.

When it is determined in step S22 that the instruction code is not a label instruction (step S22=NO), the code analysis circuit 34 determines whether or not the instruction code is a repeat instruction (step S26).

When it is determined in step S26 that the instruction code is a repeat instruction (step S26=YES), the code analysis circuit 34 outputs an instruction for repeat processing to the output control circuit 42 (step S28). In accordance with the instruction, the output control circuit 42 outputs a repeat signal to the pin control memory control circuit 50. When it is determined in step S26 that the instruction code is not a repeat instruction (step S26=NO), processing returns to step S8 skipping step S28.

Figure 15:
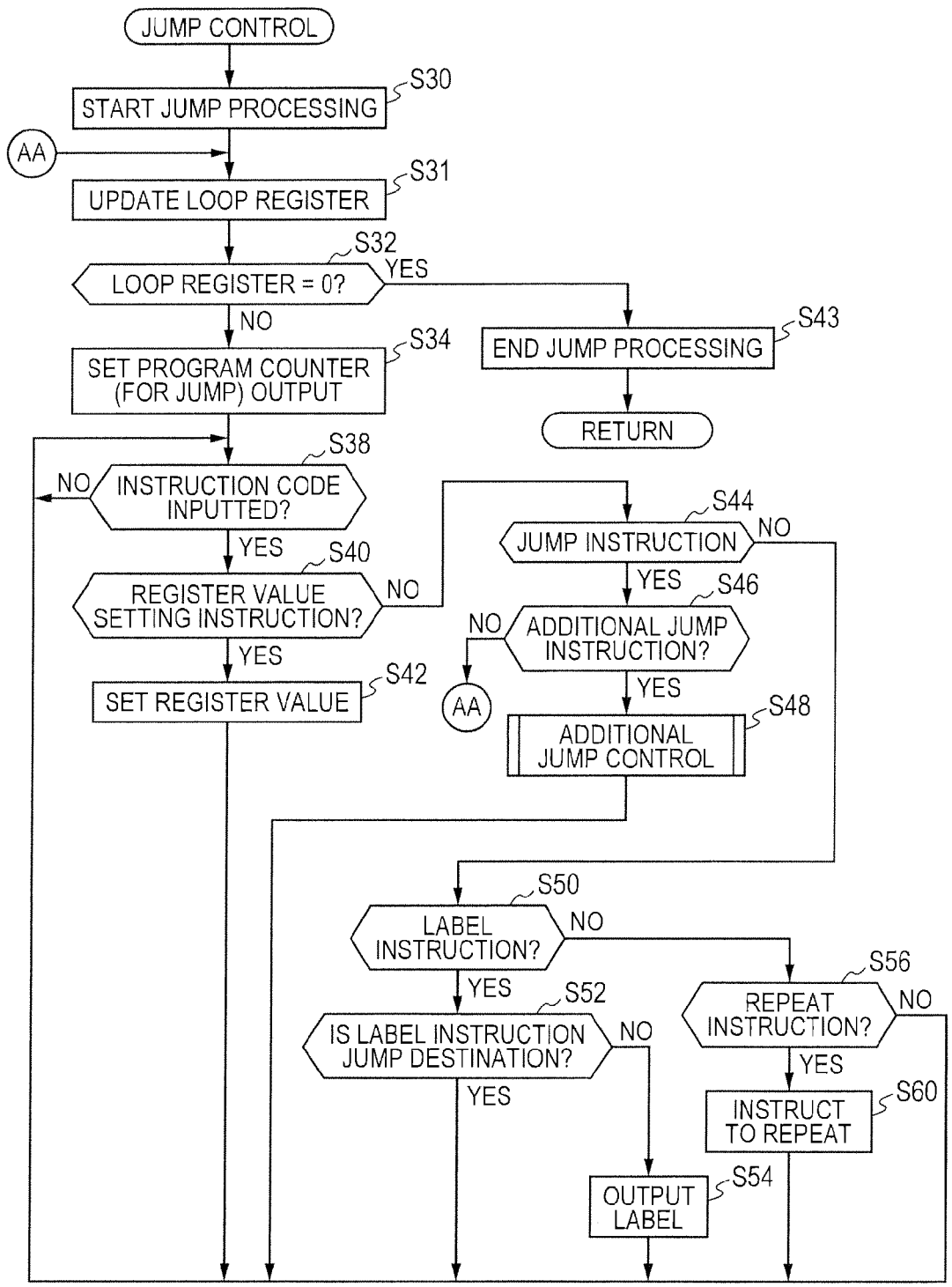
FIG. 15 is a flowchart for explaining the jump control performed in the code analysis circuit 34 according to the embodiment.

FIG. 15 is a flowchart for explaining the jump control performed in the code analysis circuit 34 according to the present embodiment.

Referring to FIG. 15, the code analysis circuit 34 first instructs the output control circuit 42 to start jump processing (step S30). In accordance with the instruction, the output control circuit 42 outputs loop mode signal "10" to the pin control memory control circuit 50.

Next, the code analysis circuit 34 updates the loop register (step S31). To be concrete, it decrements the value in the loop register (register C1 or register C2).

Next, the code analysis circuit 34 determines whether or not the value in the loop register is "0" (step S32).

When it is determined in step S32 that the value in the loop register is "0" (step S32=YES), the code analysis circuit 34 instructs the output control circuit 42 to end the jump processing (step S43). In accordance with the instruction, the output control circuit 42 outputs loop mode signal "11" to the control memory control circuit 50.

Processing is then ended (RETURN). Namely, processing advances to step S21 shown in FIG. 14.

On the other hand, when it is determined in step S32 that the value in the loop register is not "0" (step S32=NO), the code analysis circuit 34 sets the output of the program counter (for jump) 38 (step S34). To be concrete, the code analysis circuit 34 sets the PC value of the jump destination on the program counter (for jump) 38.

Next, the code analysis circuit 34 determines whether or not an instruction code read from the instruction memory (for jump) 40 in synchronization with the reference clock has been inputted (step S38).

When it is determined in step S38 that an instruction code has been inputted (step S38=YES), the code analysis circuit 34 determines whether or not the instruction code is a register value setting instruction ("C1L" or "C2L") (step S40).

When it is determined in step S40 that the instruction code is a register value setting instruction (step S40=YES), the code analysis circuit 34 sets a register value (step S42). To be concrete, the code analysis circuit 34 sets a register value in register C1 or register C2 included in the loop register 35 in accordance with the register value setting instruction.

Processing then returns to step S38.

On the other hand, when it is determined in step S40 that the instruction code is not a register value setting instruction (step S40=NO), the code analysis circuit 34 determines whether or not the instruction code is a jump instruction ("C1J" or "C2J") (step S44).

When it is determined in step S44 that the instruction code is a jump instruction (step S44=YES), the code analysis circuit 34 determines whether or not the jump instruction is an additional jump instruction (for example, jump instruction "C1J" issued during jump processing being performed in accordance with jump instruction "C2J") (step S46).

When it is determined in step S46 that the jump instruction is not an additional one (step S46=NO), processing returns to step S31 to repeat the jump processing.

On the other hand, when it is determined in step S46 that the jump instruction is an additional one (for example, jump instruction "C1J" issued during jump processing being performed in accordance with jump instruction "C2J") (step S46=YES), the code analysis circuit 34 performs additional jump control (step S48).

To be concrete, in accordance with the additional jump instruction, the flowchart shown in FIG. 15 is followed from its beginning and, when the additional jump control (step S48) is ended, processing returns to step S38 to resume the jump control that was being previously performed.

When it is determined in step S44 that the instruction code is not a jump instruction (step S44=NO), the code analysis circuit 34 determines whether or not the instruction code is a label instruction ("JST1" or "JST2") (step S50).

When it is determined in step S50 that the instruction code is a label instruction (step S50=YES), the code analysis circuit 34 determines whether or not the label instruction represents a jump destination (step S52). Namely, it is determined whether or not the instruction code corresponding to the PC value representing a jump destination address is a label instruction.

When it is determined in step S52 that the label instruction represents a jump destination (step S52=YES), processing returns to step S38 without performing any processing in accordance with the label instruction.

On the other hand, when it is determined in step S52 that the label instruction does not represent any jump destination (step S52=NO), the code analysis circuit 34 outputs an instruction for label processing to the output control circuit 42 (step S54). In accordance with the instruction, the output control circuit 42 outputs loop mode signal "01" to the pin control memory control circuit 50.

When it is determined in step S50 that the instruction code is not a label instruction (step S50=NO), the code analysis circuit 34 determines whether or not the instruction code is a repeat instruction ("REP") (step S56).

When it is determined in step S56 that the instruction code is a repeat instruction (step S56=YES), the code analysis circuit 34 outputs an instruction for repeat processing to the output control circuit 42. In accordance with the instruction, the output control circuit 42 outputs a repeat signal to the pin control memory control circuit 50.

When it is determined in step S56 that the instruction code is not a repeat instruction (step S56=NO), processing returns to step S38 skipping step S60.

Figure 16:
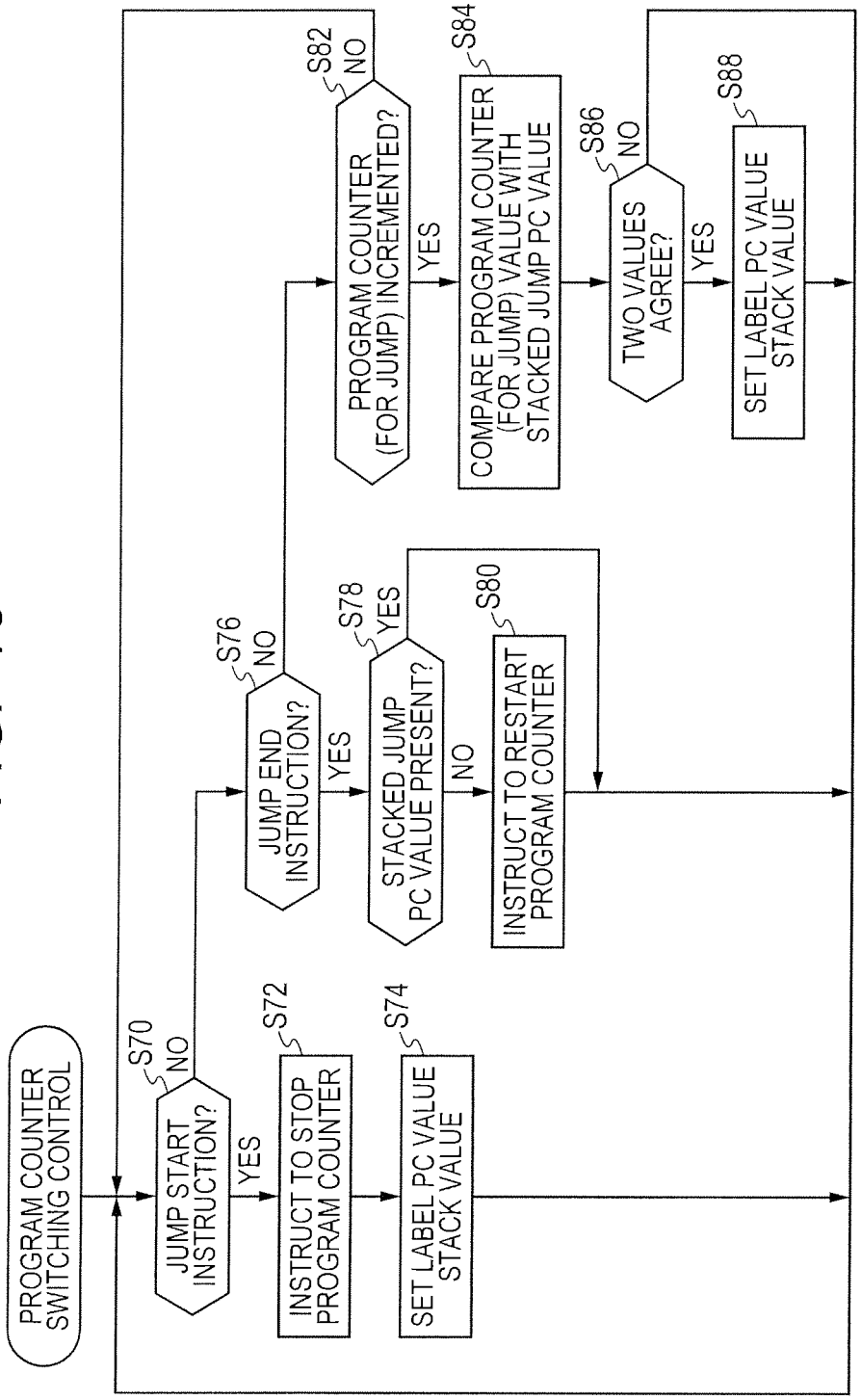
FIG. 16 is a flowchart for explaining the processing performed in a program counter switching adjustment circuit 55 according to the embodiment.

FIG. 16 is a flowchart for explaining the processing performed in the program counter switching adjustment circuit 55 according to the present embodiment.

Referring to FIG. 16, the program counter switching adjustment circuit 55 determines whether or not a jump start instruction has been inputted (step S70). To be concrete, whether or not a jump start signal B has been inputted is determined.

When it is determined in step S70 that a jump start instruction has been inputted (step S70=YES), the program counter switching adjustment circuit 55 issues an instruction to stop the program counter 52 (step S72).

Next, the program counter switching adjustment circuit 55 sets a label PC value stack value (step S74). To be concrete, the program counter switching adjustment circuit 55 sets a value stored in the label PC value stack 56 on the program counter (for jump) 60.

The above processing makes it possible to set a jump destination PC value in the program counter (for jump) 60 and jump to the specified PC value.

Processing then returns to step S70.

When it is determined in step S70 that no jump start instruction has been inputted (step S70=NO), the program counter switching adjustment circuit 55 determines whether or not a jump end instruction has been inputted (step S76). To be concrete, whether or not a jump end signal C has been inputted is determined.

When it is determined in step S76 that a jump end instruction has been inputted (step S76=YES), the program count switching adjustment circuit 55 determines whether or not a stacked jump PC value is present (step S78).

When it is determined in step S78 that there is a stacked jump PC value present (step S78=YES), processing advances to step S70 skipping step S80.

When it is determined in step S78 that no stacked jump PC value is present (step S78=NO), the program counter switching adjustment circuit 55 issues an instruction for restarting the program counter 52 (step S80).

The above processing makes it possible to restart the program counter 52 when the jump processing is ended or, when the jump processing is a double loop processing, to continue jump processing by skipping step S80.

Processing then returns to step S70.

When it is determined in step S76 that there is no jump end instruction inputted (step S76=NO), the program counter switching adjustment circuit 55 determines whether or not the PC value of the program counter (for jump) 60 has been incremented (step S82).

When it is determined in step S82 that the PC value of the program counter (for jump) 60 has not been incremented (step S82=NO), processing returns to step S70.

On the other hand, when it is determined in step S82 that the PC value of the program counter (for jump) 60 has been incremented (step S82=YES), the program counter switching adjustment circuit 55 compares the PC value of the program counter (for jump) 60 and the stacked jump PC value (step S84). Namely, the PC value stored in the jump PC value stack 58 and the PC value of the program counter (for jump) 60 are compared.

The program counter switching adjustment circuit 55 determines whether or not the two PC values agree with each other (step S86).

When it is determined in step S86 that the two PC values agree with each other (step S86=YES), the program counter switching adjustment circuit 55 sets the stacked label PC value (step S88). To be concrete, the program counter switching adjustment circuit 55 sets the PC value stored in the label PC value stack 56 on the program counter (for jump) 60.

Processing then returns to step S70.

On the other hand, when it is determined in step S86 that the two PC values do not agree with each other (step S86=NO), processing returns to step S70 skipping step S88.

The above processing makes it possible to continue a sequence of jump processing based on the PC values stored in the label PC value stack 56 and the jump PC value stack 58 until a jump end signal is inputted.

Example of Modification

Figure 17:
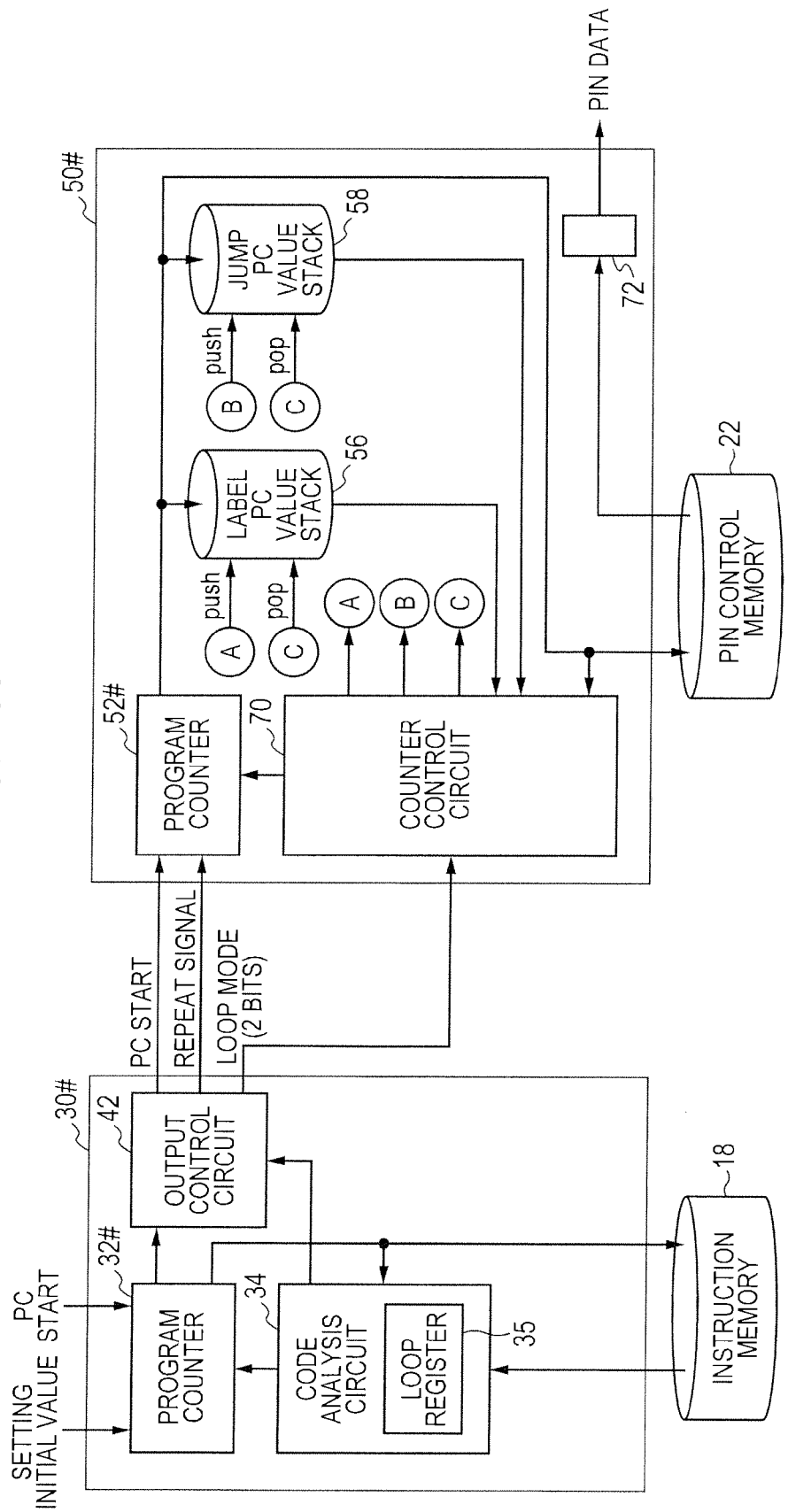
FIG. 17 is a diagram for explaining the configurations of a program counter 32# and a pin control memory control circuit 50# according to a modification of the embodiment.

FIG. 17 is a diagram for explaining the configurations of a program counter 32# and a pin control memory control circuit 50# according to a modification of the present embodiment.

Referring to FIG. 17, a program control circuit 30# does not include the selector 36, program counter (for jump) 38 and instruction memory (for jump) 40 included in the program control circuit 30 shown in FIG. 5. Also, the program control circuit 30# includes a program counter 32# and a code analysis circuit 34# instead of the program counter 32 and the code analysis circuit 34 included in the program control circuit 30.

The code analysis circuit 34# according to a modification of the present embodiment sets a jump destination PC value on the program counter 32# without involving program counter switching. Other processing performed is similar to that described above, so that detailed description of such processing will not be repeated in the following.

A pin control memory control circuit 50# does not include the program counter (for jump) 60 and pin control memory (for jump) 62 included in the pin control memory control circuit 50 shown in FIG. 6. Also, the pin control memory control circuit 50# includes a counter control circuit 70 instead of the signal generation circuit 54 and the program counter switching adjustment circuit 55 included in the pin control memory control circuit 50 shown in FIG. 6. It also includes a signal output circuit 72 instead of the selector 64 and the selector control circuit 66 included in the pin control memory control circuit 50 shown in FIG. 6.

To be concrete, the counter control circuit 70, similarly to the signal generation circuit 54, receives loop mode signals and outputs label signals A, jump start signals B and jump end signals C. Also, the counter control circuit 70 has functions similar to those of the program counter switching adjustment circuit 55. It adjusts (sets) a jump destination PC value on the program counter 52# without involving program counter switching. The PC value is read by the pin control memory 22, and the signal output circuit 72 outputs to outside the pin data outputted from the pin control memory 22. Other processing performed is similar to that described above, so that detailed description of such processing will not be repeated in the following.

The configuration according to the modification of the present embodiment is simpler than the configuration according to the present embodiment and makes it possible to test, based on a prescribed test pattern, many pins simultaneously using a greatly reduced number of wirings.

Even though the prescribed test pattern described with reference to FIG. 3 includes double-loop jump processing, the test pattern to be applied may include jump processing including three or more embedded loops.

The invention made by the present inventors has been described based on an embodiment, but the invention is not limited to the described embodiment and can be modified in various ways without departing from the scope of the invention.

What is claimed is:

1. A testing device for testing a chip, comprising,
a plurality of pin electronics substrates which can respectively output pin data corresponding to a test pattern to pins included in a chip, and
a control substrate provided to be shared by the pin electronics substrates,
wherein the control substrate includes;
a first instruction code memory storing an instruction code,
a first program counter incrementing a count value in synchronization with a clock signal from a reference clock distribution circuit,
a code analysis circuit which analyzes the instruction code read from the first instruction code memory in accordance with the count value of the first program counter, and
a control data output control circuit which outputs control data for controlling the pin electronics substrates in accordance with the instruction code analyzed by the code analysis circuit, and wherein each of the pin electronics substrates includes;
a first pin memory storing pin data,
a second program counter which increments a count value in synchronization with the clock signal, and
a pin data output control circuit which, based on control data outputted from the control data output control circuit, adjusts the count value of the second program counter and outputs pin data read from the first pin memory, the pin data being dependent on the count value of the second program counter.

2. The testing device according to claim 1:
wherein the first control substrate further includes;
a second instruction code memory which stores the instruction code read in accordance with the count value of the first program counter, associating the instruction code and the count value, and
a third program counter which is switched to from the first program counter in accordance with a jump instruction, specifying a jump destination, issued as a result of analysis of an instruction code by the code analysis circuit and increments a count value in synchronization with the clock signal, and
wherein, during jump processing, the code analysis circuit analyzes an instruction code read from the second instruction code memory in accordance with the count value of the third program counter.

3. The testing device according to claim 2,
wherein the control data output control circuit outputs a start signal for starting the second program counter, a repeat signal for instructing to output the same data again in accordance with the instruction code, and a loop mode signal for controlling jump processing.

4. The testing device according to claim 3,
wherein the pin data output control circuit includes:
a second pin memory which stores the pin data read out in accordance with the count value of the second program counter, associating the pin data and the count value;
a fourth program counter which is switched to from the second program counter in accordance with the loop mode signal and increments a count value in synchronization with the clock signal, and
a pin data switching circuit which, during jump processing, outputs the pin data read from the second pin memory in accordance with the count value of the fourth program counter and which, except during the jump processing, outputs the pin data read from the first pin memory.

5. The testing device according to claim 3,
wherein the loop mode signal includes label data for instructing to register a jump destination address, data for instructing to start jump processing, and data for instructing to end jump processing.

6. The testing device according to claim 5,
wherein the pin data output control circuit includes a stack for temporarily storing the count value of the second program counter in accordance with the label data, and
wherein the count value stored in the stack is set on the fourth program counter in accordance with the data instructing to start jump processing.

* * * * *